United States Patent
Honma et al.

(10) Patent No.: US 7,442,433 B2
(45) Date of Patent: Oct. 28, 2008

(54) SURFACE-COATED CERMET CUTTING TOOL WITH HARD COATING LAYER EXHIBITING EXCELLENT CHIPPING RESISTANCE IN HIGH-SPEED INTERMITTENT CUTTING

(75) Inventors: Hisashi Honma, Naka-gun (JP); Akira Osada, Naka-gun (JP); Eiji Nakamura, Naka-gun (JP); Takuya Hayahi, Naka-gun (JP)

(73) Assignee: Mitsubishi Materials Corporation, Tokyo (JP)

( * ) Notice: Subject to any disclaimer, the term of this patent is extended or adjusted under 35 U.S.C. 154(b) by 300 days.

(21) Appl. No.: 11/327,168

(22) Filed: Jan. 6, 2006

(65) Prior Publication Data
US 2006/0188747 A1 Aug. 24, 2006

(30) Foreign Application Priority Data
Jan. 21, 2005 (JP) .............................. 2005-013767

(51) Int. Cl.
*B23P 15/28* (2006.01)
(52) U.S. Cl. .......................... 428/216; 51/307; 51/309; 428/336; 428/697; 428/698; 428/699; 428/701; 428/702
(58) Field of Classification Search ............... 51/307, 51/309; 428/216, 336, 697, 698, 699, 701, 428/702
See application file for complete search history.

(56) References Cited
U.S. PATENT DOCUMENTS

| | | | |
|---|---|---|---|
| 5,702,808 A | 12/1997 | Ljungberg et al. | |
| 5,766,782 A | 6/1998 | Ljungberg et al. | |
| 5,786,069 A | 7/1998 | Ljungberg et al. | |
| 6,251,508 B1 | 6/2001 | Ruppi | |
| 6,767,627 B2 * | 7/2004 | Morikawa et al. | 428/336 |
| 7,241,492 B2 * | 7/2007 | Kohara et al. | 428/701 |
| 7,276,301 B2 * | 10/2007 | Tsushima et al. | 428/698 |

(Continued)

FOREIGN PATENT DOCUMENTS
EP 753603 1/1997

(Continued)

OTHER PUBLICATIONS
Patent Abstracts of Japan for JP06-031501 published Feb. 8, 1994.

(Continued)

*Primary Examiner*—Archene Turner
(74) *Attorney, Agent, or Firm*—Darby & Darby P.C.

(57) ABSTRACT

A surface-coated cermet cutting tool is formed by depositing on a surface of a tool substrate a hard-coating layer composed of the following layers (a) and (b):

(a) the lower layer is composed of one or more layers of TiC, TiN, TiCN, TiCO, and TiCNO and has a total average layer thickness in the range of 3 to 20 μm, and (b) the upper layer is an aluminum oxide layer having an α-type crystal structure when chemically deposited and has an average layer thickness in the range of 1 to 15 μm. In the case of the upper layer, the reformed $\alpha$-$Al_2O_3$ layer shows distribution graphs of covalent lattice points of constituent atoms, which shows distribution ratios of individual $\Sigma N+1$ to total $\Sigma N+1$, having the highest peak at $\Sigma 3$ and showing the distribution ratios of $\Sigma 3$ to total $\Sigma N+1$ in the range of 60 to 80%.

1 Claim, 5 Drawing Sheets

U.S. PATENT DOCUMENTS

| | | |
|---|---|---|
| 2002/0081432 A1 | 6/2002 | Nordgren et al. |
| 2002/0155325 A1 | 10/2002 | Martensson |
| 2004/0028951 A1 | 2/2004 | Ruppi |
| 2006/0003187 A1 | 1/2006 | Osada et al. |
| 2006/0035111 A1 | 2/2006 | Osada et al. |

FOREIGN PATENT DOCUMENTS

| | | |
|---|---|---|
| JP | 06-008010 | 1/1994 |
| JP | 06-031503 | 2/1994 |
| WO | WO-98/10119 | 3/1998 |

OTHER PUBLICATIONS

Patent Abstracts of Japan for JP06-008010 published Jan. 18, 1994.

* cited by examiner

○ : O
· : Al

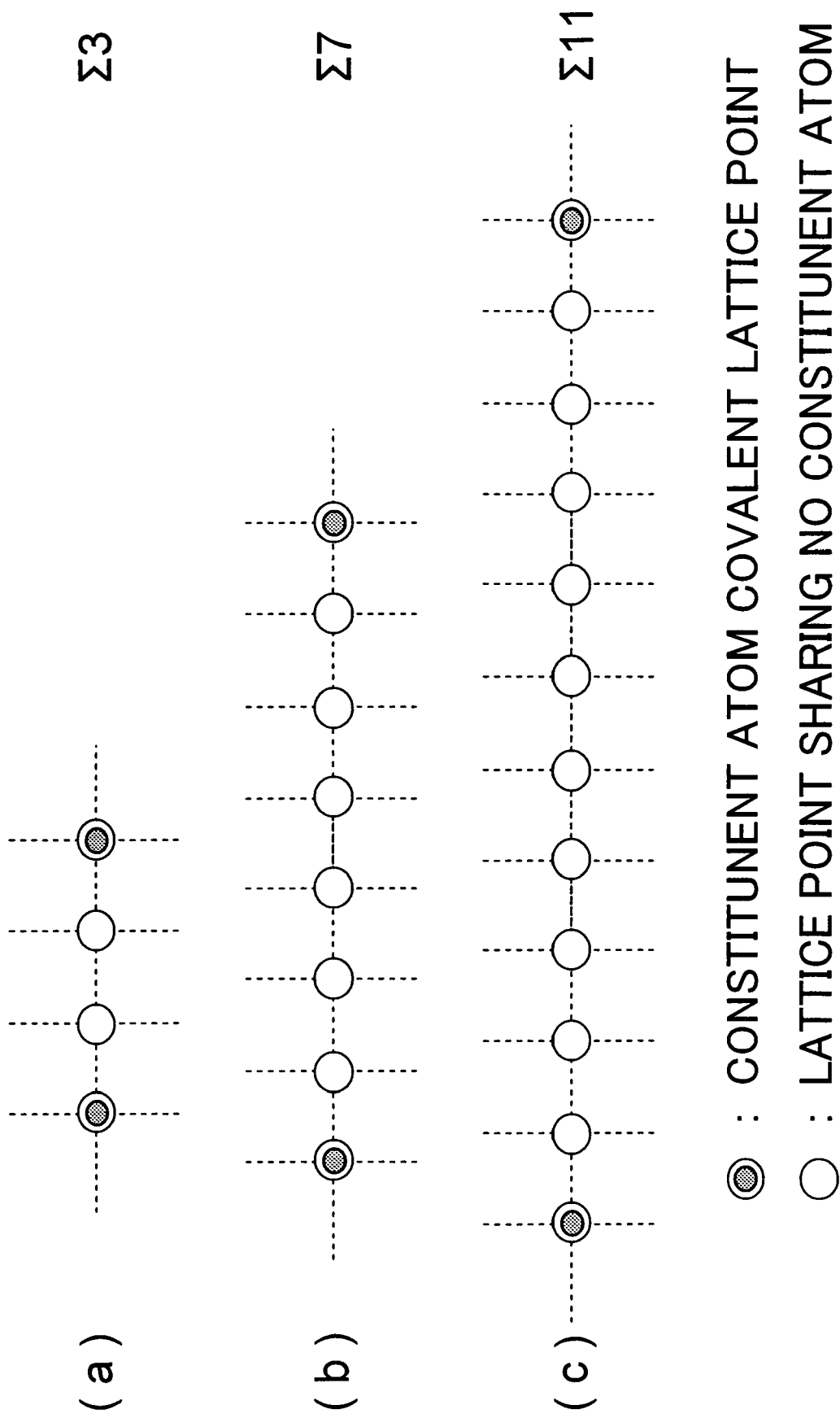

SURFACE-COATED CERMET CUTTING TOOL WITH HARD COATING LAYER EXHIBITING EXCELLENT CHIPPING RESISTANCE IN HIGH-SPEED INTERMITTENT CUTTING

INCORPORATION BY REFERENCE

The present application claims priority under 35 U.S.C. §119 to Japanese Patent Application No. 2005-013767 filed on Jan. 21, 2005. The content of the application is incorporated herein by reference in its entirety.

BACKGROUND OF THE INVENTION

1. Field of the Invention

The present invention relates to a surface-coated cermet cutting tool (hereinafter, referred to as a coated cermet tool) in which a hard coating layer exhibits excellent chipping resistance, in particular, even when intermittent cutting of various workpieces, such as steel and cast iron, is performed under high-speed cutting conditions.

2. Description of the Related Art

A coated cermet tool generally formed by depositing on a surface of a substrate (hereinafter, generally referred to as a tool substrate) made of tungsten carbide (hereinafter, referred to as WC)—based cemented carbide or titanium carbonitride (hereinafter, referred to as TiCN)—based cermet a hard-coating layer composed of the following upper and lower layers:

(a) the lower layer is composed of one or more layers of titanium carbide (hereinafter, referred to as TiC) layer, titanium nitride (hereinafter, referred to as TiN) layer, titanium carbonitride (hereinafter, referred to as TiCN) layer, titanium carboxide (hereinafter, referred to as TiCO) layer, and titanium oxycarbonitride (hereinafter, referred to as TiCNO) layer and has a total average layer thickness in the range of 3 to 20 μm, and (b) the upper layer is an aluminum oxide layer having an α-crystal structure (hereinafter, referred to as an $\alpha\text{-}Al_2O_3$ layer) when chemically deposited and has an average layer thickness in the range of 1 to 15 μm is known, JP-A-6-31503 and it is also well known that the coated cermet tool is widely used for continuous or intermittent cutting of, for example, various steel or cast iron.

In addition, it is well known JP-A-6-8010 that, in the coated cermet tool, layers composing the hard-coating layer generally have a granular crystal structure, and the TiCN layer composing the titanium compound layer, the lower layer, is made to have a longitudinally grown crystal structure, which is formed by using a mixed gas that includes organic carbonitride as a reaction gas in a general chemical vapor deposition reactor at a moderate temperature range from 700 to 950° C. for the purpose of increasing the strength of the layer.

Furthermore, it is also well known that the $\alpha\text{-}Al_2O_3$ layer composing the hard-coating layer of the coated cermet tool is formed with crystal grains having a corundum hexagonal close-packed structure, in which constituent atoms consisting of aluminum and oxygen exist in lattice points, that is, the atomic array in a unit lattice of the $\alpha\text{-}Al_2O_3$ has a crystal structure shown in schematic views [FIG. 1A is a perspective view and FIG. 1B is a plan view showing cross-sectional layers 1 to 9].

[Patent Document 1] JP-A-6-31503
[Patent Document 2] JP-A-6-8010

In recent years, even though the performance of cutting devices has been markedly improved, labor saving, energy saving and cost reduction for cutting work are strongly demanded, and, accordingly, the cutting work is carried out at a higher speed range. The conventional coated cermet tools generally present no problem when they are used for continuous cutting or intermittent cutting of steel, cast iron or the like under normal conditions. However, when the conventional cutting tools are used for intermittent cutting under high-speed cutting conditions, the $\alpha\text{-}Al_2O_3$ layer composing the hard-coating layer does not has sufficient impact resistance, thereby chipping (minute crack) easily occurs on the hard coating layer, and thus the lifespan of the cutting tool is reduced.

SUMMARY OF THE INVENTION

From the above-mentioned viewpoints, the present inventors have conducted studies, particularly, for improving an impact resistance of $\alpha\text{-}Al_2O_3$ layer composing a upper layer of a hard coating layer of a coated cermet tool and have obtained the following results:

(a) even though the $\alpha\text{-}Al_2O_3$ layer, as the upper layer composing the hard coating layer of the conventional coated cermet tool, is deposited by using, for example, a general chemical vapor deposition reactor under the following conditions (referred to as normal conditions):

Composition of reaction gas: on a basis of volume, $AlCl_3$ of 2 to 4%, $CO_2$ of 6 to 8%, HCl of 1.5 to 3%, $H_2S$ of 0.05 to 0.2%, and $H_2$ as balance Temperature of reaction atmosphere: 1020 to 1050° C.

Pressure of reaction atmosphere: 6 to 10 kPa, if the $\alpha\text{-}Al_2O_3$ layer is deposited under the following conditions:

Composition of reaction gas: on a basis of volume, $AlCl_3$ of 6 to 10%, $CO_2$ of 10 to 15%, HCl of 3 to 5%, $H_2S$ of 0.05 to 0.2%, and $H_2$ as balance Temperature of reaction atmosphere: 1020 to 1050° C.

Pressure of reaction atmosphere: 3 to 5 kPa that is, if the $\alpha\text{-}Al_2O_3$ layer is deposited under the conditions such that the content ratios of $AlCl_3$, $CO_2$, and HCl in the reaction gas are relatively higher and the pressure of reaction atmosphere is relatively lower than those of the normal conditions (high content ratio of reaction gas component and low pressure conditions), the $\alpha\text{-}Al_2O_3$ layer (hereinafter, referred to as a "reformed $\alpha\text{-}Al_2O_3$ layer") formed under the high content ratio of reaction gas component and low pressure condition has improved high-temperature strength and excellent mechanical impact resistance. Therefore, in a coated cermet tool having the reformed $\alpha\text{-}Al_2O_3$ layer as the upper layer of the hard-coating layer and the titanium compound layer as the lower layer of the hard-coating layer, the hard-coating layer exhibits excellent chipping resistance and shows excellent wear resistance for a prolonged period of time, particularly, in the high-speed intermittent cutting accompanying severe mechanical impact.

(b) As regards to the conventional $\alpha\text{-}Al_2O_3$ layer (hereinafter referred to as a conventional $\alpha\text{-}Al_2O_3$ layer) composing the upper layer of the hard-coating layer of the conventional coated cermet tool and the reformed $\alpha\text{-}Al_2O_3$ layer, when electron beam is radiated to crystal grains in a measuring range of polished surfaces, as illustrated in schematic explanatory views of FIGS. 2A and 2B, so as to measure inclination angles (even though FIG. 2A shows a case that the inclination angle of a crystal grain is zero and FIG. 2B shows a case that the inclination angle of a crystal grain is 45 degrees, all inclination angles of individual crystal grains including the above inclination angles are included) between normal lines of plane (0001) and plane (10-10), crystal planes of the crystal grains, and a normal line of the polished surface by using a field-emission-type scanning electron microscope, in this case, the crystal grains have a corundum-type hexagonal close-packed structure in which constituent atoms consisting of aluminum and oxygen exist in lattice points, as described above; the distribution of the lattice points (the covalent lattice points of constituent atoms) where the respective constituent atoms share one constituent atom between adjacent crystal grains at the interface of the crystal grains are calculated on the basis of the inclination angles obtained from the measurement; a covalent lattice point configuration of constituent atoms, in which N(N is any even number equal to or greater than two in consideration of the corundum-type hexagonal close-packed structure, but if an upper limit of N from the viewpoint of distribution frequencies is 28, even numbers such as 4, 8, 14, 24, and 26 do not exist) lattice points sharing no constituent atom between the covalent lattice points of constituent atoms exist is represented by the $\Sigma N+1$, (in this case, the configurations of covalent lattice points of constituent atoms of $\Sigma 5$, $\Sigma 9$, $\Sigma 15$, $\Sigma 25$, and $\Sigma 27$ do not exist); distribution graphs of covalent lattice points of constituent atoms, which shows distribution ratios of individual $\Sigma N+1$ to total $\Sigma N+1$, are prepared, the conventional $\alpha$-$Al_2O_3$ layer, shows a distribution graph of covalent lattice points of constituent atoms, in which the distribution ratios of $\Sigma 3$ is relatively low, that is 30% or less as illustrated in FIG. 5, whereas the reformed $\alpha$-$Al_2O_3$ layers shows a distribution graph of covalent lattice points of constituent atoms, in which the distribution ratios of $\Sigma 3$ are extremely high, that is, 60 to 80% as illustrated in FIG. 4. These high distribution ratios of $\Sigma 3$ change into the content ratios of $AlCl_3$, $CO_2$, and HCl composing the reaction gas and the atmospheric reaction pressure.

Meanwhile, FIGS. 3A to 3C show that unit configurations of $\Sigma 3$, $\Sigma 7$, and $\Sigma 11$ among the covalent lattice point configurations of the constituent atoms at the interface of adjacent grains in the reformed $\alpha$-$Al_2O_3$ layer and conventional $\alpha$-$Al_2O_3$.

(c) Since the reformed $\alpha$-$Al_2O_3$ layer has greater high-temperature strength than the conventional $\alpha$-$Al_2O_3$ layer as well as excellent high-temperature hardness and heat resistance inherent, in a coated cermet tool having the above layer as the upper layer of the hard coating layer, the hard-coating layer exhibits better chipping resistance by combining with the excellent high-temperature strength of the TiCN layer, the lower layer of the hard-coating layer, than the conventional coated cermet tool formed by depositing the conventional $\alpha$-$Al_2O_3$ as the upper layer even when the tool is used for an intermittent cutting under high-speed cutting conditions.

The inventors have obtained the results illustrated in the above (a) to (c).

The invention has been contrived on the basis of the above results and relates to the coated cermet tool, the hard-coating layer of which exhibits excellent chipping resistance in a high-speed intermittent cutting. The coated cermet tool is formed by depositing on a surface of a tool substrate made of tungsten carbide-based cemented alloy or titanium carbonitride-based cermet a hard-coating layer composed of the following layers (a) and (b):

(a) the lower layer is composed of one or more layers of TiC layer, TiN layer, TiCN layer, TiCO layer, and TiCNO layer and has a total average layer thickness in the range of 3 to 20 µm; and (b) the upper layer is an aluminum oxide layer having an α-crystal structure when chemically deposited and has an average layer thickness in the range of 1 to 15 µm. In addition, the reformed $\alpha$-$Al_2O_3$ layer shows distribution graphs of covalent lattice points of constituent atoms, which shows distribution ratios of individual $\Sigma N+1$ to total $\Sigma N+1$, having the highest peak at $\Sigma 3$ and showing the distribution ratios of $\Sigma 3$ to total $\Sigma N+1$ in the range of 60 to 80% when electron beam is radiated to crystal grains in a measuring range of polished surfaces so as to measure inclination angles between normal lines of plane (0001) and plane (10-10), crystal planes of the crystal grains, and a normal line of the polished surface by using a field-emission-type scanning electron microscope, in this case, the crystal grains have a corundum-type hexagonal close-packed structure in which constituent atoms consisting of aluminum and oxygen exist in lattice points, as described above; the distribution of the lattice points (the covalent lattice points of constituent atoms) where the respective constituent atoms share one constituent atom between adjacent crystal grains at the interface of the crystal grains are calculated on the basis of the inclination angles obtained from the measurement; a covalent lattice point configuration of constituent atoms, in which N (N is any even number equal to or greater than two in consideration of the corundum-type hexagonal close-packed structure, but if an upper limit of N from the viewpoint of distribution frequencies is 28, even numbers such as 4, 8, 14, 24, and 26 do not exist) lattice points sharing no constituent atom between the covalent lattice points of constituent atoms exist is represented by the $\Sigma N+1$.

Next, the reasons why the numerical values are limited, as described above, in the layers composing the hard coating layer of the coated cermet layer will be described.

(a) Ti Compound Layer as Lower Layer

A Ti compound layer exists as a lower layer of an $\alpha$-$Al_2O_3$ layer. Also, the excellent high temperature strength inherent in the Ti compound layer contributes to high-temperature strength of the hard-coating layer. In addition, the Ti compound layer is firmly adhered to both of the tool substrate and the $\alpha$-$Al_2O_3$ layer. Accordingly, the Ti compound layer improves the adherence of the hard-coating layer to the tool substrate. However, if the total average layer thickness of the Ti compound layer is less than 3 µm, the above function cannot be sufficiently obtained. On the other hand, when the total average layer thickness thereof exceeds 20 µm, thermal plastic deformation is likely to occur, particularly, in a high-speed intermittent cutting accompanying the generation of high heat, which causes partial wear. Accordingly, the average layer thickness of the lower layer is preferably set in the range of 3 to 20 µm.

(b) Reformed $\alpha$-$Al_2O_3$ Layer as Upper Layer

The distribution ratios of the $\Sigma 3$ on the distribution graph of covalent lattice points of constituent atoms of the reformed $\alpha$-$Al_2O_3$ layer can be set in the range of 60 to 80% by adjusting the content ratios of $AlCl_3$, $CO_2$, and HCl composing the reaction gas and the atmospheric reaction pressure, as described above. In this case, if the distribution ratios of the $\Sigma 3$ are less than 60%, chipping may occur in the hard-coating layer during high-speed intermittent cutting, therefore, the improvement of high-temperature strength cannot be ensured. Accordingly, it is more desirable that the $\Sigma 3$ have higher distribution ratios. However, if the distribution ratios of the $\Sigma 3$ become higher than 80%, it is difficult to form the layer. Therefore, the distribution ratios of the $\Sigma 3$ are set in the range of 60 to 80%. As such, the reformed $\alpha$-$Al_2O_3$ layer has much better high-temperature strength in addition to excellent high temperature hardness and heat resistance inherent in the $\alpha$-$Al_2O_3$ layer, as described above. However, if the average layer thickness is less than 1 µm, the hard-coating layer cannot be sufficiently provided with the above characteristics. On the other hand, if the average layer thickness exceeds 15 µm, thermal plastic deformation that causes partial wear is likely to occur. Accordingly, the average layer thickness of the upper layer is preferably set in the range of 1 to 15 µm.

In addition, in order to identify whether the cutting tool is used, the TiN layer having a gold color tone can be deposited as the uppermost surface layer of the hard-coating layer as needed. In this case, the average layer thickness of the TiN layer is preferably in the range of 0.1 to 1 μm. The reason why the average layer thickness is limited is as follows: when the average layer thickness is less than 0.1 μm, sufficient identification cannot be achieved, and the identification by the TiN layer can be sufficiently obtained when the average layer thickness reaches 1 μm.

BRIEF DESCRIPTION OF THE DRAWINGS

FIGS. 1A and 1B are schematic views showing the atomic configuration of a unit lattice of corundum-type hexagonal close-packed crystal composing an $\alpha$-$Al_2O_3$ layer, in which FIG. 1A is a perspective view, and FIG. 1B are plan views of cross-sections 1 to 9;

FIGS. 3A-3C are schematic views showing unit configurations of covalent lattice point configurations of constituent atoms at the interfaces of adjacent crystal grains, in which FIG. 3A shows a unit configuration of Σ3, FIG. 3B shows a unit configuration of Σ7, and FIG. 3C shows a unit configuration of Σ11;

DESCRIPTION OF THE PREFERRED EMBODIMENTS

Figure 1A:
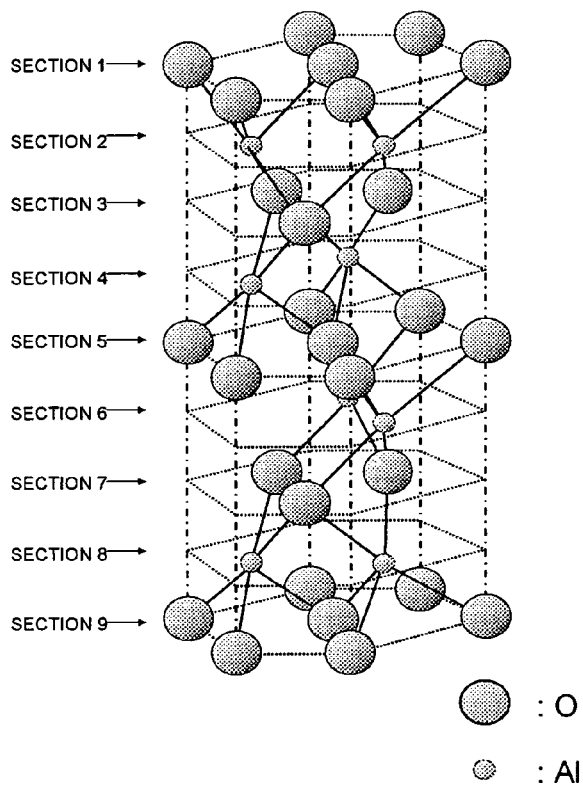
Figure 1B:
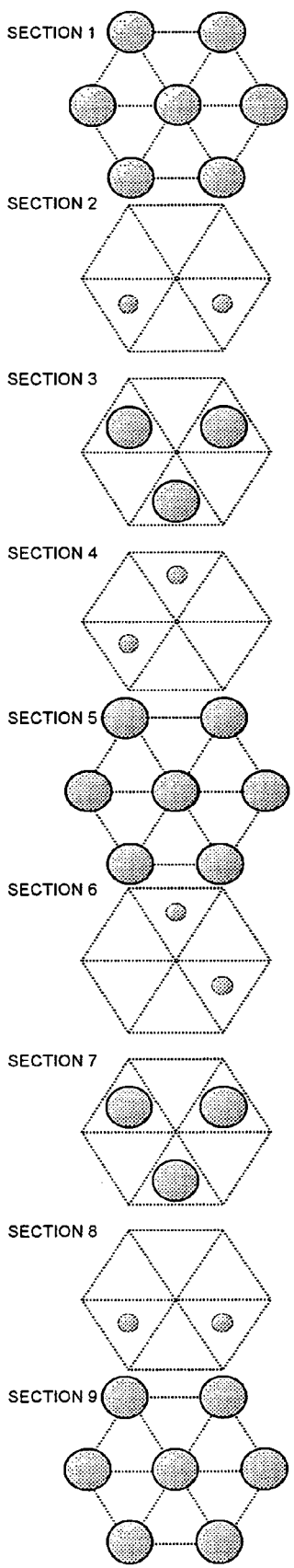
Figure 2A:
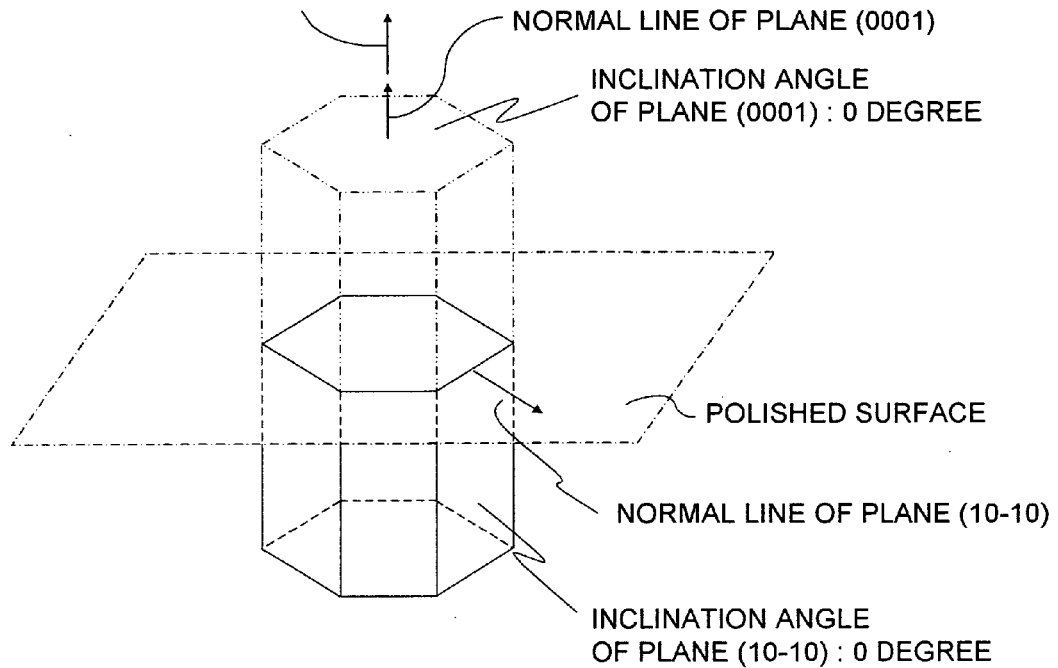
FIGS. 2A and 2B are schematic explanatory views showing measuring aspects of inclination angles of the plane (0001) plane and the plane (10-10) of crystal grains in the $\alpha$-$Al_2O_3$ layer.
Figure 2B:
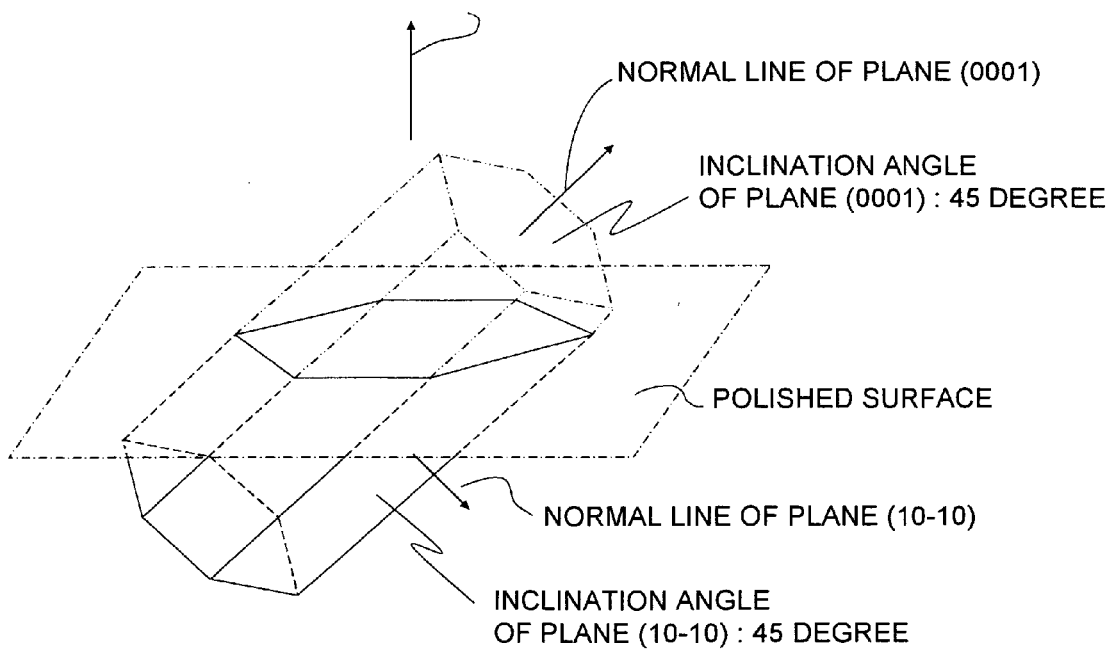

Next, a coated cermet tool according to the invention will be described in detail with reference to embodiments.

Embodiments

The following powders, each having a mean particle size in the range of 1 to 3 μm, are prepared as raw materials for substrates: WC powder, TiC powder, ZrC powder, VC powder, TaC powder, NbC powder, $Cr_3C_2$ powder, TiN powder, TaN powder, and Co powder. These raw powders are compounded one another on the basis of the compositions shown in Table 1, and then mixed one another with wax in an acetone for 24 hours by a ball mill. After that, the solution is dried under reduced pressure, and then pressed into a green compact having a predetermined shape at a pressure of 98 MPa. The green compact is vacuum-sintered under the following conditions: pressure of 5 Pa, predetermined temperature range of 1370° C. to 1470° C., and holding time of 1 hour. After the sintering, cutting edges were subjected to a horning process (R: 0.07 mm) so as to manufacture WC-based cemented carbide tool substrates A to F having a throwaway tip shape defined by ISO•CNMG160412.

Furthermore, the following powders, each having a mean particle size in the range of 0.5 to 2 μm, are prepared as raw materials for substrates: TiCN (TiC/TiN=50/50 in weight ratio) powder, $Mo_2C$ power, ZrC power, NbC powder, TaC powder, WC power, Co powder and Ni powder. These raw powders are compounded one another on the basis of the compositions shown in Table 2 and then wet-mixed one another for 24 hours by the ball mill. After that, the compound is dried and then pressed into a green compact at a pressure of 98 MPa. The green compact is sintered in a nitrogen atmosphere under the following conditions: pressure of 1.3 kPa, temperature of 1540° C., and holding time of 1 hour. After the sintering, cutting edges are subjected to the horning process (R: 0.07 mm) so as to manufacture TiCN-based cermet tool substrates a to f having a tip shape defined by ISO •CNMG160412.

Next, the tool substrates A to F and the tool substrates a to f are loaded into a general chemical deposition reactor, and then titanium compound layers are deposited as lower layers of the hard-coating layers in accordance with combinations and target layer thicknesses shown in Table 4 under conditions shown in Table 3 (in Table 3, l-TiCN represents forming conditions of TiCN layers having a longitudinally grown crystal structure described in JP-A-6-8010, and the others represent forming conditions of a general granular crystal structure). Next, similarly, any of the reformed $\alpha$-$Al_2O_3$ layers (a) to (f) is deposited as the upper layers of the hard-coating layers in accordance with the combinations and target layer thicknesses shown in Table 4 under the conditions shown in Table 3 so as to manufacture the coated cermet tools 1 to 13 of the invention.

In addition, for the purpose of comparison, the conventional cermet tools 1 to 13 are manufactured under the same conditions as the above except that, as shown in Table 5, any of the conventional $\alpha$-$Al_2O_3$ layers (a) to (f) is deposited as the upper layers of the hard-coating layers in accordance with the combinations and target layer thicknesses shown in Table 4 under the conditions shown in Table 3.

Next, distribution graphs of covalent lattice points of constituent atoms are prepared for the reformed $\alpha$-$Al_2O_3$ layers and the conventional $\alpha$-$Al_2O_3$ layers composing the upper layers of the hard-coating layers of the coated cermet tools 1 to 13 of the invention and conventional cermet tools 1 to 13 by using a field-emission-type scanning electron microscope.

That is, the distribution graphs of covalent lattice points of constituent atoms are prepared by the following steps: first, polished surfaces of the reformed $\alpha$-$Al_2O_3$ layers and the conventional $\alpha$-$Al_2O_3$ layers are set in a lens-barrel of the field-emission-type scanning electron microscope. After that, electron beams having an acceleration voltage of 15 kV are radiated on individual crystal grains in a measuring range on the polished surfaces with an irradiating current of 1 nA at an incidence angle of 70 degrees. Next, inclination angles between normal lines of the plane (0001) and the plane (10-10), crystal planes of the crystal grains, and a normal line of the polished surfaces are measured at an interval of 0.1 μm/step in an area of 30×50 μm by using an electron back-scattering diffraction image device. Based on the measured inclination angles, the distribution of the lattice points (the covalent lattice points of constituent atoms) where the respective constituent atoms share one constituent atom among adjacent crystal grains at the interface of the crystal grains is calculated. Finally, individual distribution ratios of ΣN+1 to total ΣN+1 are obtained when a covalent lattice point configuration of constituent atoms, in which "N" (N is any even number equal to or greater than two in a corundum-type hexagonal close-packed structure, but if an upper limit of N is 28 from the viewpoint of distribution frequencies, even numbers such as 4, 8, 14, 24, and 26 do not exist) lattice points sharing no constituent atom among the covalent lattice points of constituent atoms exist, is represented by ΣN+1.

On the resulting distribution graphs of covalent lattice points of constituent atoms of the various reformed $\alpha$-$Al_2O_3$ layers and the conventional $Al_2O_3$ layers, distribution ratios of Σ3 to total ΣN+1 (a sum of the respective distribution ratios of Σ3, Σ7, Σ11, Σ13, Σ17, Σ19, Σ21, Σ23, and Σ29 obtained from the above results) are shown in Tables 4 and 5 respectively.

On the above various distribution graphs of covalent lattice points of constituent atoms, as shown in Tables 4 and 5, the reformed α-$Al_2O_3$ layers of the coated cermet tools of the invention show a distribution graph of covalent lattice points of constituent atoms, in which the distribution ratios of Σ3 are 60 to 80%, whereas the conventional α-$Al_2O_3$ layers of the conventional coated cermet tools show a distribution graph of covalent lattice points of constituent atoms, in which the distribution ratios of Σ3 are 30% of less.

Figure 4:
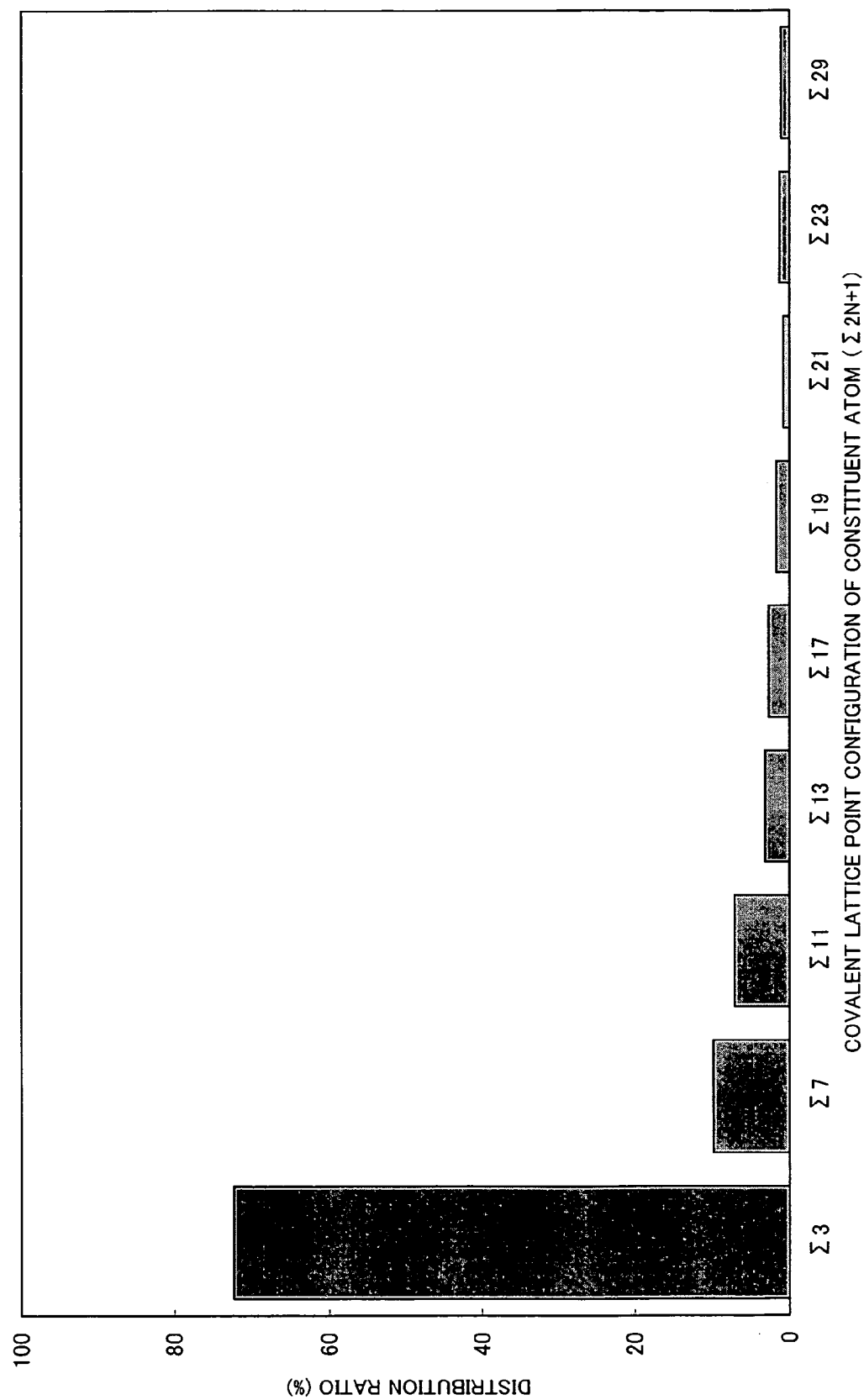
FIG. 4 is a distribution graph of covalent lattice points of constituent atoms of a reformed $\alpha$-$Al_2O_3$ layer of a coated cermet tool 3 of the invention.
Figure 5:
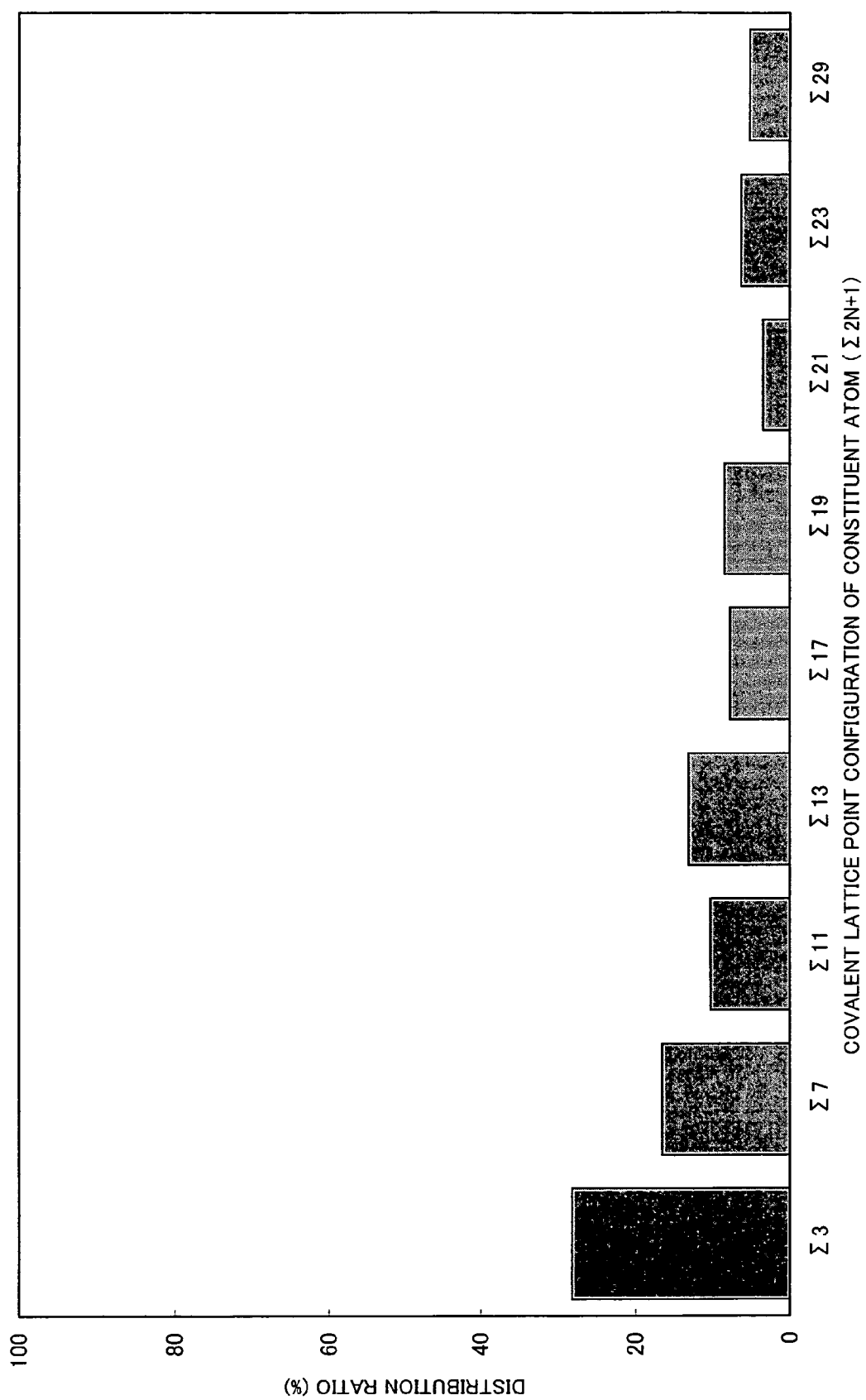
FIG. 5 is a distribution graph of covalent lattice points of constituent atoms of a conventional $\alpha$-$Al_2O_3$ layers of a conventional coated cermet tool 5.

Meanwhile, FIG. 4 is a distribution graph of covalent lattice points of constituent atoms of the reformed α-$Al_2O_3$ layers of the coated cermet tools 3 of the invention, and FIG. 5 is a distribution graph of covalent lattice points of constituent atoms of the conventional α-$Al_2O_3$ layers of the conventional coated cermet tools 5.

As a result of the measurement of the thickness of each layer composing the hard coating layers of the coated cermet cutting tools 1 to 13 and the conventional coated cermet tools 1 to 13 by using a scanning electron microscope (measurement of longitudinal section), all tools show the average layer thicknesses (an average value of five measuring points) substantially equal to the target layer thickness.

Next, in a state that various coated cermet tools such as the coated cermet tools 1 to 13 of the invention and the conventional coated cermet tools 1 to 13 are screw-fixed to a tip of a tool steel bite with a fixing jig, A dry high-speed intermittent cutting test (normal cutting speed is 200 m/min) of carbon steel is carried out under the following condition (referred to as cutting condition A):
Workpiece: a JIS•S48C round bar having four longitudinal grooves equidistantly arranged in the longitudinal direction
Cutting speed: 350 m/min
Cutting depth: 1.5 mm
Feed rate: 0.2 mm/rev
Cutting time: 10 min, A dry high-speed intermittent cutting test (normal cutting speed is 150 m/min) of alloy steel is carried out under the following condition (referred to as cutting condition B):
Workpiece: a JIS•SNCM439 round bar having four longitudinal grooves equidistantly arranged in the longitudinal direction
Cutting speed: 300 m/min
Cutting depth: 2 mm
Feed rate: 0.15 mm/rev
Cutting time: 10 min, A dry high-speed intermittent cutting test (normal cutting speed is 180 m/min) of ductile cast iron is carried out under the following condition (referred to as cutting condition C):

Workpiece: a JIS•FCD600 round bar having four longitudinal grooves equidistantly arranged in the longitudinal direction
Cutting speed: 350 m/min
Cutting depth: 2 mm
Feed rate: 0.20 mm/rev
Cutting time: 10 min, and then, the flank wear width of a cutting edge is measured in each test. The measurement results are shown in Table 6.

TABLE 1

| Type | Compounding composition (mass %) | | | | | | | | | |
|---|---|---|---|---|---|---|---|---|---|---|
| | Co | TiC | ZrC | VC | TaC | NbC | $Cr_3C_2$ | TiN | TaN | WC |
| Tool substrate | | | | | | | | | | |
| A | 7 | — | — | — | — | — | — | — | — | Balance |
| B | 5.7 | — | — | — | 1.5 | 0.5 | — | — | — | Balance |
| C | 5.7 | — | — | — | — | — | 1 | — | — | Balance |
| D | 8.5 | — | 0.5 | — | — | — | 0.5 | — | — | Balance |
| E | 12.5 | 2 | — | — | — | — | — | 1 | 2 | Balance |
| f | 6.5 | 2 | — | 0.2 | — | 3 | 0.8 | 1.5 | — | Balance |

TABLE 2

| Type | Compounding composition (mass %) | | | | | | | |
|---|---|---|---|---|---|---|---|---|
| | Co | Ni | ZrC | TaC | NbC | $Mo_2C$ | WC | TiCN |
| Tool substrate | | | | | | | | |
| a | 13 | 5 | — | 10 | — | 10 | 16 | Balance |
| b | 8 | 7 | — | 5 | — | 7.5 | — | Balance |
| c | 5 | — | — | — | — | 6 | 10 | Balance |
| d | 10 | 5 | — | 11 | 2 | — | — | Balance |
| e | 9 | 4 | 1 | 8 | — | 10 | 10 | Balance |
| f | 12 | 5.5 | — | 10 | — | 9.5 | 14.5 | Balance |

TABLE 3

| Layer composing hard-coating layer | Forming condition (kPa denotes atmospheric reaction pressure and ° C. denotes temperature) | | |
|---|---|---|---|
| | Reaction gas composition | Reaction atmosphere | |
| Type | (volume %) | Pressure | Temperature |
| TiC Layer | $TiCl_4$: 4.2%, $CH_4$: 8.5%, $H_2$: balance | 7 | 1020 |
| TiN Layer (First layer) | $TiCl_4$: 4.2%, $CH_4$: 30%, $H_2$: balance | 30 | 900 |
| TiN Layer (Other layers) | $TiCl_4$: 4.2%, $CH_4$: 35%, $H_2$: balance | 50 | 1040 |
| l-TiCN layer | $TiCl_4$: 4.2%, $N_2$: 20%, $CH_3CN$: 0.6%, $H_2$: balance | 7 | 900 |
| TiCN layer | $TiCl_4$: 4.2%, $N_2$: 20%, $CH_4$: 4%, $H_2$: balance | 12 | 1020 |
| TiCO layer | $TiCl_4$: 4.2%, CO: 4%, $H_2$: balance | 7 | 1020 |
| TiCNO Layer | $TiCl_4$: 4.2%, CO: 3%, $CH_4$: 3%, $N_2$: 20%, $H_2$: balance | 20 | 1020 |
| Conventional α-$Al_2O_3$ layer (a) | $AlCl_3$: 2%, $CO_2$: 6%, HCl: 1.5%, $H_2S$: 0.05%, $H_2$: balance | 9 | 1040 |

TABLE 3-continued

| Layer composing hard-coating layer Type | Reaction gas composition (volume %) | Reaction atmosphere Pressure | Reaction atmosphere Temperature |
|---|---|---|---|
| Conventional α-Al$_2$O$_3$ layer (b) | AlCl$_3$: 2.4%, CO$_2$: 6.3%, HCl: 1.5%, H$_2$S: 0.05%, H$_2$: balance | 10 | 1040 |
| Conventional α-Al$_2$O$_3$ layer (c) | AlCl$_3$: 2.9%, CO$_2$: 6.8%, HCl: 2%, H$_2$S: 0.05%, H$_2$: balance | 6 | 1050 |
| Conventional α-Al$_2$O$_3$ layer (d) | AlCl$_3$: 3.3%, CO$_2$: 7.3%, HCl: 2.5%, H$_2$S: 0.1%, H$_2$: balance | 8 | 1030 |
| Conventional α-Al$_2$O$_3$ layer (e) | AlCl$_3$: 3.7%, CO$_2$: 7.6%, HCl: 2.5%, H$_2$S: 0.15%, H$_2$: balance | 7 | 1020 |
| Conventional α-Al$_2$O$_3$ layer (f) | AlCl$_3$: 4%, CO$_2$: 8%, HCl: 3%, H$_2$S: 0.2%, H$_2$: balance | 6 | 1020 |
| Reformed α-Al$_2$O$_3$ layer (a) | AlCl$_3$: 6%, CO$_2$: 10%, HCl: 3%, H$_2$S: 0.05%, H$_2$: balance | 5 | 1050 |
| Reformed α-Al$_2$O$_3$ layer (b) | AlCl$_3$: 7%, CO$_2$: 11.2%, HCl: 3.5%, H$_2$S: 0.1%, H$_2$: balance | 4.7 | 1040 |
| Reformed α-Al$_2$O$_3$ layer (c) | AlCl$_3$: 7.9%, CO$_2$: 12.3%, HCl: 4%, H$_2$S: 0.15%, H$_2$: balance | 4.4 | 1030 |
| Reformed α-Al$_2$O$_3$ layer (d) | AlCl$_3$: 8.7%, CO$_2$: 13.3%, HCl: 4%, H$_2$S: 0.15%, H$_2$: balance | 3.9 | 1030 |
| Reformed α-Al$_2$O$_3$ layer (e) | AlCl$_3$: 9.4%, CO$_2$: 14.2%, HCl: 4.5%, H$_2$S: 0.2%, H$_2$: balance | 3.4 | 1020 |
| Reformed α-Al$_2$O$_3$ layer (f) | AlCl$_3$: 10%, CO$_2$: 15%, HCl: 5%, H$_2$S: 0.2%, H$_2$: balance | 3 | 1020 |

TABLE 4

Hard coating layer (numeral in parentheses in lower layers denotes target layer thickness: μm)

| Tool Type | Tool substrate symbol | Lower layer First layer | Lower layer Second layer | Lower layer Third layer | Lower layer Fourth layer | Upper layer Symbol | Upper layer Target layer thickness (μm) | Distribution ratio (%) of Σ3 |
|---|---|---|---|---|---|---|---|---|
| Coated cermet tool of the invention | | | | | | | | |
| 1 | a | TiN (1) | 1-TiCN (17.5) | TiN (1) | TiCNO (0.5) | (c) | 2 | 69 |
| 2 | A | TiCN (1) | 1-TiCN (8.5) | TiCO (0.5) | — | (a) | 6 | 60 |
| 3 | b | TiN (1) | 1-TiCN (4) | TiC (4) | TiCNO (1) | (d) | 9 | 73 |
| 4 | B | TiC (1) | 1-TiCN (9) | — | — | (b) | 1 | 65 |
| 5 | c | TiN (1) | 1-TiCN (4.5) | TiCNO (0.5) | — | (c) | 7 | 71 |
| 6 | C | TiN (0.5) | 1-TiCN (1.5) | TiC (0.5) | TiCNO (0.5) | (d) | 12 | 75 |
| 7 | d | TiN (0.5) | 1-TiCN (10) | TiC (2) | TiCNO (0.3) | (f) | 10 | 79 |
| 8 | D | TiN (1) | TiCN (19) | — | — | (e) | 5 | 77 |
| 9 | e | TiC (0.5) | 1-TiCN (9) | TiCO (0.5) | — | (e) | 11 | 76 |
| 10 | E | TiN (1) | TiCN (1) | TiCN (7) | TiCO (1) | (b) | 4 | 67 |
| 11 | f | TiN (1) | TiCN (1) | 1-TiCN (8) | — | (d) | 7 | 72 |
| 12 | F | TiC (1) | 1-TiCN (4) | TiCNO (1) | — | (f) | 15 | 80 |
| 13 | D | TiCN (0.5) | TiCN (2) | TiCNO (0.5) | — | (a) | 3 | 62 |

TABLE 5

| | | Hard-coating layer | | | | | | |
|---|---|---|---|---|---|---|---|---|
| | | Lower layer | | | | Upper layer (Conventional α-Al$_2$O$_3$ layer) | | |
| | Tool | (Ti compound layer) | | | | Target Layer | Thickness | Distribution ratio |
| Type | substrate symbol | First layer | Second layer | Third layer | Fourth layer | Symbol | (μm) | (%) of Σ3 |
| Conventional coated cermet tool | | | | | | | | |
| 1 | The same as the coated cermet tool 1 of the invention | | | | | (a) | 2 | 24 |
| 2 | The same as the coated cermet tool 2 of the invention | | | | | (c) | 6 | 17 |
| 3 | The same as the coated cermet tool 3 of the invention | | | | | (d) | 9 | 21 |
| 4 | The same as the coated cermet tool 4 of the invention | | | | | (f) | 1 | 26 |
| 5 | The same as the coated cermet tool 5 of the invention | | | | | (e) | 7 | 28 |
| 6 | The same as the coated cermet tool 6 of the invention | | | | | (b) | 12 | 14 |
| 7 | The same as the coated cermet tool 7 of the invention | | | | | (c) | 10 | 22 |
| 8 | The same as the coated cermet tool 8 of the invention | | | | | (a) | 5 | 10 |
| 9 | The same as the coated cermet tool 9 of the invention | | | | | (b) | 11 | 16 |
| 10 | The same as the coated cermet tool 10 of the invention | | | | | (f) | 4 | 30 |
| 11 | The same as the coated cermet tool 11 of the invention | | | | | (d) | 7 | 19 |
| 12 | The same as the coated cermet tool 12 of the invention | | | | | (a) | 15 | 12 |
| 13 | The same as the coated cermet tool 13 of the invention | | | | | (d) | 3 | 20 |

TABLE 6

| | Flank wear width of (mm) | | | | Cutting test result | | |
|---|---|---|---|---|---|---|---|
| Type | Cutting condition (A) | Cutting condition (B) | Cutting condition (C) | Type | Cutting condition (A) | Cutting condition (B) | Cutting condition (C) |
| Coated cermet tool of the invention | | | | Conventional coated cermet tool | | | |
| 1 | 0.22 | 0.23 | 0.25 | 1 | 3.8 min. ☐ | 3.9 min. ☐ | 2.5 min. ☐ |
| 2 | 0.16 | 0.18 | 0.21 | 2 | 6.3 min. ☐ | 5.7 min. ☐ | 5.8 min. ☐ |
| 3 | 0.13 | 0.14 | 0.17 | 3 | 6.0 min. ☐ | 5.1 min. ☐ | 5.1 min. ☐ |
| 4 | 0.22 | 0.24 | 0.27 | 4 | 7.5 min. ☐ | 6.9 min. ☐ | 6.6 min. ☐ |
| 5 | 0.15 | 0.16 | 0.20 | 5 | 6.9 min. ☐ | 6.7 min. ☐ | 6.0 min. ☐ |
| 6 | 0.09 | 0.11 | 0.14 | 6 | 4.1 min. ☐ | 3.3 min. ☐ | 2.9 min. ☐ |
| 7 | 0.11 | 0.14 | 0.15 | 7 | 4.6 min. ☐ | 4.0 min. ☐ | 3.8 min. ☐ |
| 8 | 0.19 | 0.18 | 0.22 | 8 | 2.5 min. ☐ | 1.3 min. ☐ | 0.7 min. ☐ |
| 9 | 0.09 | 0.12 | 0.15 | 9 | 3.4 min. ☐ | 2.7 min. ☐ | 2.1 min. ☐ |
| 10 | 0.18 | 0.19 | 0.22 | 10 | 7.1 min. ☐ | 7.3 min. ☐ | 6.9 min. ☐ |
| 11 | 0.13 | 0.15 | 0.18 | 11 | 5.7 min. ☐ | 5.5 min. ☐ | 4.6 min. ☐ |

TABLE 6-continued

| | Flank wear width of (mm) | | | | Cutting test result | | |
|---|---|---|---|---|---|---|---|
| Type | Cutting condition (A) | Cutting condition (B) | Cutting condition (C) | Type | Cutting condition (A) | Cutting condition (B) | Cutting condition (C) |
| 12 | 0.07 | 0.08 | 0.12 | 12 | 2.4 min. ☐ | 2.2 min. ☐ | 1.5 min. ☐ |
| 13 | 0.20 | 0.20 | 0.24 | 13 | 7.2 min. ☐ | 7.0 min. ☐ | 6.3 min. ☐ |

(In Table 6, mark ☐ shows cutting time until each of the cermet tools reaches the end of its service life due to the chipping generated on the hard coating layer.)

It is apparent from the results shown in Tables 4 to 6 that the coated cermet tools 1 to 13 of the invention have the upper layers of the hard coating layers, which are composed of the reformed α-Al$_2$O$_3$ layers showing the distribution graph of covalent lattice points of constituent atoms, in which the distribution ratios of the Σ3 are 60 to 80%, and the reformed α-Al$_2$O$_3$ layers have better high-temperature strength and exhibit excellent chipping resistance even in high-speed intermittent cutting of steel or cast iron having extremely high mechanical impact, thereby occurrence of chipping in the hard-coating layers is markedly suppressed and excellent wear resistance is exhibited. In contrast, the conventional coated cermet tools 1 to 13 have the upper layers of the hard coating layers, which are composed of the conventional α-Al$_2$O$_3$ layers showing the distribution graph of covalent lattice points of constituent atoms, in which the distribution ratios of the Σ3 are 30% or less, and insufficient mechanical impact resistance in high-speed intermittent cutting, thereby chipping is caused in the hard-coating layers, and the lifespan is relatively short As described above, in the coated cermet tools of the invention, the hard-coating layers exhibits excellent chipping resistance particularly in the high-speed intermittent cutting that requires high temperature strength as well as in the continuous cutting or intermittent cutting of various steels, cast iron, etc. under normal conditions and exhibits an excellent cutting performance for a prolonged period of time, thereby it is possible to satisfactorily deal with the demands for high performance of cutting tools, labor saving, energy saving, and cost reduction in cutting work.

According to the coated cermet tool of the invention, the reformed α-Al$_2$O$_3$ layer composing the upper layer of the hard-coating layer can have better high-temperature strength as well as the high-temperature hardness and heat resistance inherent in Al$_2$O$_3$ even when high-speed intermittent cutting accompanying strong mechanical impact is performed under high-speed cutting conditions. Therefore, the coated cutting tool exhibits excellent chipping resistance, and thus the lifespan can be extended.

What is claimed is:
1. A surface-coated cermet cutting tool, formed by depositing on a surface of a tool substrate made of tungsten carbide-based cermeted carbide or titanium carbonitride-based cermet a hard-coating layer comprising the following layers (a) and (b):
(a) a lower layer comprising one or more layers of titanium carbide layer, titanium nitride layer, titanium carbonitride layer, titanium carboxide layer, and titanium oxycarbonitride layer and has a total average layer thickness in the range of 3 to 20 μm,
(b) a upper layer is an aluminum oxide layer having an α-type crystal structure when chemically deposited and having an average layer thickness in the range of 1 to 15 μm; wherein the α-Al$_2$O$_3$ layer shows distribution graphs of covalent lattice points of constituent atoms, which shows distribution ratios of individual ΣN+1 to total ΣN+1, having a highest peak at Σ3 and showing the distribution ratios of Σ3 to total ΣN+1 in the range of 60 to 80% when electron beam is radiated to crystal grains in a measuring range of polished surfaces so as to measure inclination angles between normal lines of plane (0001) and plane (10-10), crystal planes of the crystal grains, and a normal line of the polished surface by using a field-emission-type scanning electron microscope, the crystal grains have a corundum-type hexagonal close-packed structure in which constituent atoms consisting of aluminum and oxygen exist in lattice points; the distribution of the lattice points, which are the covalent lattice points of constituent atoms, where the respective constituent atoms share one constituent atom between adjacent crystal grains at an interface of the crystal grains are calculated on the basis of the inclination angles obtained from the measurement; a covalent lattice point configuration of constituent atoms, in which N, where is any even number equal to or greater than two in consideration of the corundum-type hexagonal close-packed structure, but if an upper limit of N from the viewpoint of distribution frequencies is 28, even numbers such as 4, 8, 14, 24, and 26 do not exist, lattice points sharing no constituent atom among the covalent lattice points of constituent atoms exist is represented by ΣN+1,
wherein the hard-coating layer exhibits excellent chipping resistance in a high-speed intermittent cutting.

* * * * *